United States Patent
Lee

(10) Patent No.: US 8,384,172 B2
(45) Date of Patent: Feb. 26, 2013

(54) IMAGE SENSOR HAVING REFLECTIVE METAL LINES UNDER PHOTOELECTRIC CONVERSION DEVICES

(75) Inventor: Yun-Ki Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 306 days.

(21) Appl. No.: 12/649,451

(22) Filed: Dec. 30, 2009

(65) Prior Publication Data

US 2010/0171191 A1 Jul. 8, 2010

(30) Foreign Application Priority Data

Jan. 6, 2009 (KR) .................. 10-2009-0000836

(51) Int. Cl.
*H01L 31/0232* (2006.01)

(52) U.S. Cl. ............. 257/432; 257/98; 257/83; 257/88; 438/28; 438/29; 438/70; 438/34

(58) Field of Classification Search ........... 257/E31.124, 257/459, 431, 448, 461, 470, 457, 444, 653, 257/417, 79, 88, 89, 90, E31.097, E31.127, 257/E31.123, 80, 83, 84, 95, 98, 432, 414; 438/22, 27, 28, 29, 24, 69, 65, 70, 35, 34

See application file for complete search history.

(56) References Cited

U.S. PATENT DOCUMENTS

| 7,888,763 B2 * | 2/2011 | Qian et al. ............... 257/460 |
| 2006/0086956 A1 | 4/2006 | Furukawa et al. |
| 2007/0001100 A1 | 1/2007 | Hsu et al. |
| 2009/0020842 A1 * | 1/2009 | Shiau et al. .............. 257/459 |

FOREIGN PATENT DOCUMENTS

| JP | 2006-054262 | 2/2006 |
| JP | 2006-120805 | 5/2006 |
| JP | 2007-013147 | 1/2007 |
| KR | 1020060054129 | 5/2006 |
| KR | 1020080049004 | 6/2008 |

\* cited by examiner

*Primary Examiner* — Ha Tran T Nguyen
*Assistant Examiner* — Thanh Y Tran
(74) *Attorney, Agent, or Firm* — F. Chau & Associates, LLC

(57) ABSTRACT

An image sensor includes at least one photoelectric conversion device formed in a silicon substrate, at least one lens formed on one side of the photoelectric conversion device and configured to collect light, a dielectric layer formed on the other side of the photoelectric conversion device and a reflective pattern formed on the dielectric layer. The reflective pattern serves as an electrical circuit interconnection and is configured to reflect the light passing through the dielectric layer such that the light is absorbed to the silicon substrate again.

17 Claims, 6 Drawing Sheets

IMAGE SENSOR HAVING REFLECTIVE METAL LINES UNDER PHOTOELECTRIC CONVERSION DEVICES

CROSS-REFERENCE TO RELATED APPLICATION

This application claims priority to Korean Patent Application No. 10-2009-0000836, filed on Jan. 6, 2009, the disclosure of which is hereby incorporated by reference herein in its entirety.

BACKGROUND

1. Technical Field

The present disclosure relates to image sensors and to methods of fabricating the same. More particularly, the present disclosure relates to rear light-receiving type image sensors, having improved optical sensitivity and to methods of fabricating the same.

2. Description of Related Art

In general, image sensors are semiconductor devices that convert incident light into an electrical signal. These image sensors may be roughly classified into charge coupled devices (CCDs) and complementary metal oxide semiconductor (CMOS) image sensors. Among them, the CMOS image sensors convert an electric charge into a voltage in each unit pixel, and output a signal from a signal line by a switching operation.

In general, the CMOS image sensors are each composed of a photo sensing part for sensing light and a CMOS logic circuit part for processing the sensed light into an electrical signal and converting the electrical signal into data. To enhance the photo sensitivity, an effort is being made to increase a percentage which an area of the photo sensing part accounts for of the total area of the image sensor. However, as the logic circuit part is not fundamentally removed, this effort has been subject to definite limitations.

Thus, additional efforts are being made to enhance the photo sensitivity of the above-mentioned CMOS image sensors. One of the efforts is a light collecting technique, which converts a path of the light incident on other regions than the photo sensing part and collects the light on the photo sensing part. Among them, one is designed to form a micro-lens on a color filter. However, this method of enhancing the photo sensitivity using the light collecting technique may nevertheless have a certain degree of limitations in enhancing the photo sensitivity as the image sensors are still more highly integrated.

SUMMARY

Example embodiments may provide a rear light-receiving type image sensor, in which light is incident on the rear surface of a silicon substrate without passing through a plurality of interconnection layers disposed in front of the silicon substrate, and a method of fabricating the same.

Example embodiments may also provide an image sensor, in which a reflector reflects light transmitted to a dielectric layer and collects the reflected light on a silicon substrate even when the silicon substrate is too thin to absorb long-wavelength light due to a reduction in pixel size, and a method of fabricating the same.

Example embodiments may also provide an image sensor, in which a reflective pattern is formed using an existing electrical circuit interconnection to freely form a reflector regardless of the layout of an interconnection layer, and a method of fabricating the same.

Example embodiments may also provide an image sensor, in which a reflective pattern is formed using an electrical circuit interconnection, and simultaneously in a line-and-space type to have the same reflectance as a plane-type reflector, and a method of fabricating the same.

Example embodiments may also provide an image sensor, in which a reflective pattern is formed in a line-and-space type, and a line interval is optimized to prevent light from passing through the interval and being lost.

Example embodiments may also provide an image sensor, in which even when a reflective pattern is insufficiently formed using an electrical circuit interconnection, the reflective pattern is supplemented in combination with a dummy pattern to optimize a line interval, and a method of fabricating the same.

Example embodiments may also provide an image sensor, in which metal lines serving as electrical circuit interconnections are arranged to maintain a minimum line interval in a longitudinal or transverse direction, or are mixed and arranged in longitudinal and transverse directions, thereby minimizing a loss of light caused by diffraction and optimizing reflection, and in which, even if the number of metal lines serving as electrical circuit interconnections is absolutely too small to satisfy the minimum line interval between the metal lines, a dummy pattern not serving as the electrical circuit interconnection is further provided in a line-and-space type like the metal lines or in a box type, thereby improving optical sensitivity of a rear light-receiving section, and a method of fabricating the same.

In accordance with an example embodiment, an image sensor is provided. The image sensor includes at least one photoelectric conversion device formed in a silicon substrate, at least one lens foamed on one side of the photoelectric conversion device and configured to collect light, a dielectric layer formed on the other side of the photoelectric conversion device, and a reflective pattern formed on the dielectric layer. The reflective patterns serves as an electrical circuit interconnection and is configured to reflect the light passing through the dielectric layer such that the light is absorbed to the silicon substrate again.

In example embodiments, the photoelectric conversion device may include an impurity junction layer formed under the silicon substrate to convert light energy into an electrical signal.

In example embodiments, the reflective pattern may include metal lines serving to operate a circuit.

In example embodiments, the circuit may include a logic device processing the electrical signal converted by the photoelectric conversion device and converting the electrical signal into data or a peripheral circuit device formed therearound to control the photoelectric conversion device and the logic device and process signals of the devices.

In example embodiments, the metal lines may be formed in a line-and-space type.

In example embodiments, the metal lines may be configured such that a minimum line interval therebetween is determined depending on a refractive index of the dielectric layer and is inversely proportional to the refractive index of the dielectric layer.

In example embodiments, the dielectric layer is formed of an oxide, and the minimum line interval is determined to be less than 200 nm in a range of visible light having a wavelength of 600 nm or more.

In example embodiments, the metal lines may be configured so that a minimum line interval between the metal lines is determined depending on a wavelength of light and proportional to the wavelength of light.

In example embodiments, the line-and-space type metal lines may be arranged at regular intervals in a longitudinal direction. Further, the line-and-space type metal lines may be arranged at regular intervals in a transverse direction. In addition, the line-and-space type metal lines may be mixed and arranged in longitudinal and transverse directions.

In example embodiments, the metal lines may further include a dummy pattern between the metal lines such that a minimum line interval between the metal lines is obtained. Further, the dummy pattern may be formed in the line-and-space type or in a box type.

In accordance with an example embodiment, a rear light-receiving type image sensor is provided. The rear light-receiving type image sensor includes a silicon substrate having a rear light receiving section formed therein and the rear light receiving section includes at least one photodiode. The rear light-receiving type image sensor further includes a plurality of color filters formed on a rear surface of the silicon substrate, a plurality of micro-lens formed on the plurality of color filters and configured to collect light and a dielectric layer formed on a front surface of the silicon substrate opposite to the plurality of color filters and the plurality of micro-lens. The dielectric layer is composed of one of silicon dioxide ($SiO_2$), plasma deposited silicon nitride (P-SiN), or silicon oxynitride (SiON), and the dielectric layer includes at least one metal line serving as an interconnection formed therein. The at least one metal line is formed in a line-and-space type and reflects light such that the light passing through the silicon substrate is absorbed to the silicon substrate again without being lost in a front direction of the silicon substrate and is collected on the rear light receiving section again.

In example embodiments, the metal line may be configured so that a shape thereof is determined by a minimum line interval between the metal lines through which no light is allowed to pass by diffraction. The minimum line interval may be proportional to a wavelength of applied light to increase as the wavelength becomes long, and be inversely proportional to a refractive index of the dielectric layer to decrease as the refractive index become high. For example, in a range of visible light having a wavelength of 600 nm or more, the dielectric layer may include an oxide layer having a refractive of 1.5 or less such that the minimum line interval is less than 200 nm.

In example embodiments, when the minimum line interval serving as the interconnections is insufficient, the metal lines serving as the interconnections may further include dummy patterns, which do not serve as the interconnections, between the metal lines, so that requirements for the minimum line interval can be met.

In accordance with another example embodiment, a method of fabricating an image sensor is provided. The image sensor includes forming at least one photodiode on one surface of a silicon substrate through an ion implantation process, forming a dielectric layer prior to metallization on the other surface of the silicon substrate having the photodiode, forming at least one metal line on the dielectric layer in a line-and-space pattern using aluminum, copper or tungsten, depositing a dielectric layer posterior to metallization on the at least one metal line, and planarizing the dielectric layer through a planarization process. The method may further include turning upside down the silicon substrate to process a side opposite to the metal line, attaching a support plate, which is made of material identical to the silicon substrate or the dielectric layer, to the dielectric layer to process the opposite side, back-lapping the silicon substrate to adjust a thickness of the silicon substrate and forming at least one color filter and micro-lens on the back-lapped silicon substrate.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1:
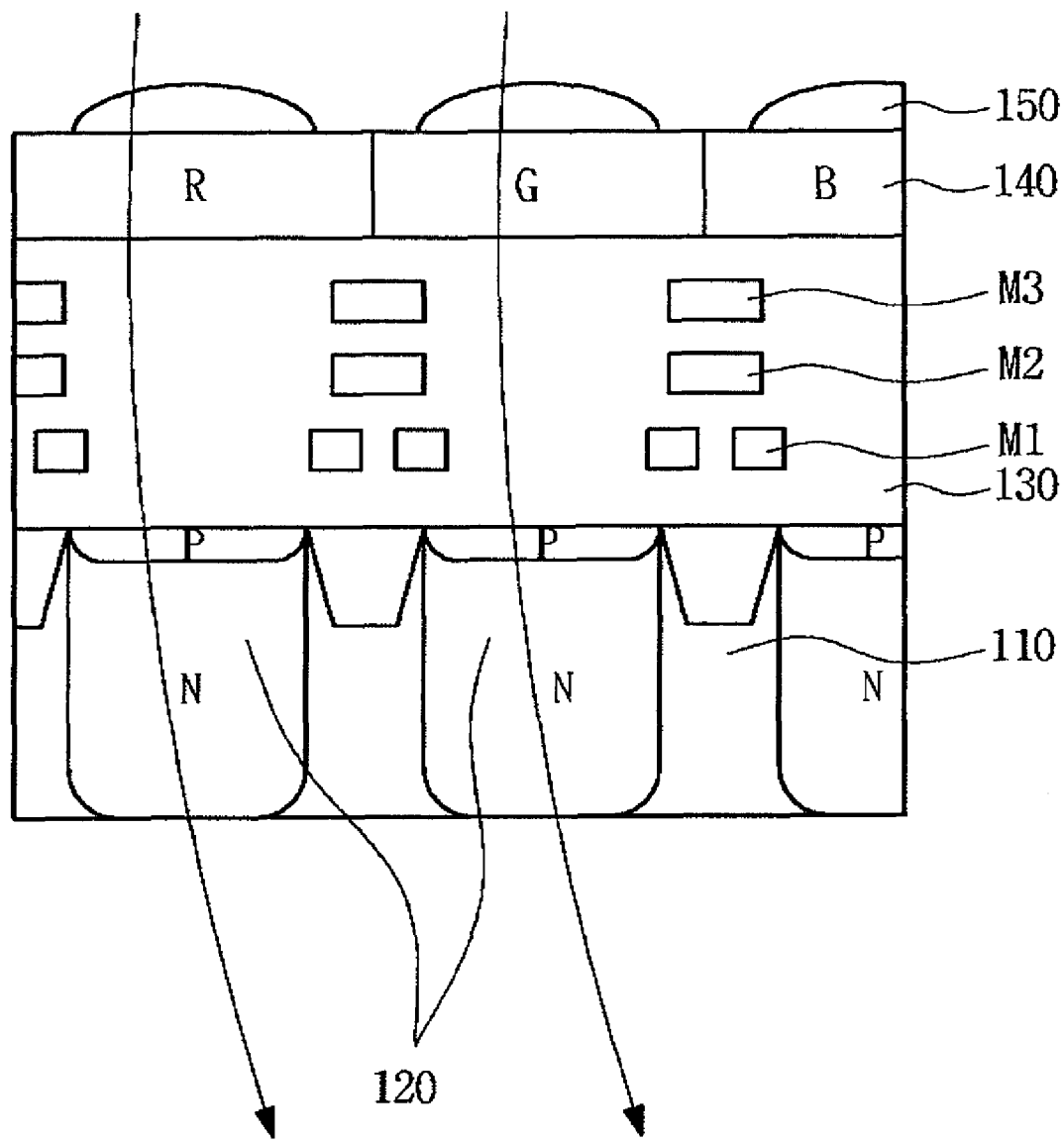
FIG. 1 is a cross-sectional view of a front light-receiving type image sensor according to an example embodiment.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending on the functionality/acts involved.

To more specifically describe example embodiments, various aspects will be described in detail with reference to the attached drawings. However, the present invention is not limited to example embodiments described.

Reference will now be made in greater detail to an image sensor and to a method of fabricating the same according to example embodiments with reference to the accompanying drawings.

According to example embodiments, the image sensor may be divided into an active pixel sensor region where a plurality of unit pixels are arranged in a matrix pattern, and a peripheral circuit region in which a peripheral circuit is formed to control the unit pixels or process signals of the unit pixels. Further, the active pixel sensor region may be divided into a photoelectric conversion device converting light energy into an electrical signal, and a logic device processing the converted electrical signal into data.

The photoelectric conversion device serves to accumulate electric charges created by absorbing energy of incident light. Thus, this photoelectric conversion device typically, mainly uses a photodiode, but is not limited to the photodiode alone. Thus, any device such as a photo transistor that can convert light energy into an electrical signal may be used as the photoelectric conversion device. Herein, the photodiode will be described by way of example.

The logic device is composed of a plurality of metal oxide semiconductor (MOS) transistors. The MOS transistors may include a transfer transistor transferring optical charges collected by a photodiode to a floating diffusion region, a reset transistor setting a potential of the floating diffusion region to a desired value and discharging the charges to reset the floating diffusion region, a drive transistor serving as a source follower buffer amplifier, and a select transistor for switching and addressing.

Hereinafter, a configuration of the image sensor will be described on the basis of the photoelectric conversion device.

As illustrated in FIG. 1, a high-concentration p-type (p++) region and a p-type epitaxial (p-epi) layer are stacked on a silicon substrate 110. The silicon substrate 110 is configured so that n-type regions are formed below the surface thereof by deep ion implantation, and p-type regions are formed under the surface thereof, thereby forming photodiodes 120. In addition, a high-concentration n-type (n+) floating diffusion region may be further formed under the surface of the silicon substrate 110 at one side of each photodiode 120 by ion implantation, so that the floating diffusion region can receive and store accumulated charges from the photodiodes.

A dielectric layer 130 for Raining metal lines is formed on the silicon substrate 110 having the photodiodes. A plurality of metal lines M1, M2 and M3 serving as an interconnection are formed in the dielectric layer 130. The metal lines M1, M2 and M3 are designed to connect power-supply and signal lines with the unit pixel and a logic circuit. Actually, more metal lines may be provided. Here, the dielectric layer 130 has a plurality of inter layer dielectrics (ILDs) in proportion to the number of layers of the metal lines. Also, the ILDs D1, D2 and D3 may be formed corresponding to the metal lines M1, M2 and M3.

Color filters 140 are formed on the dielectric layer 130 to represent RGB colors for the respective unit pixels. A micro-lens 150 is formed on each color filter to collect light.

Thus, the incident light is collected by the micro-lens 150, and then is incident on the photodiode 120. As the image sensor 100 of the example embodiment is implemented as a front light-receiving type image sensor, in the front of which the photodiodes 120 are located, the incident light passing through the micro-lenses 150 reaches the light-receiving section, e.g., the photodiodes 120, after the incident light passes through the interconnection layer of the metal lines M1 and M2 and M3 and the dielectric layer 130. As such, sensitivity of the light receiving section tends to be reduced.

Meanwhile, the metal lines M1 and M2 and M3 are jumped up and down. This is for preventing the light from being screened by the metal lines when the front light-receiving occurs, and particularly for preventing the light from being incident on other regions than the photodiodes 120.

However, although the metal lines are arranged in a horizontal direction or in a vertical direction, the light incident on the photodiodes 120 may have no alternative but to get interference due to the numerous metal lines M1 and M2 and M3. As a result, it may be very difficult to avoid the reduction in sensitivity.

Figure 3:
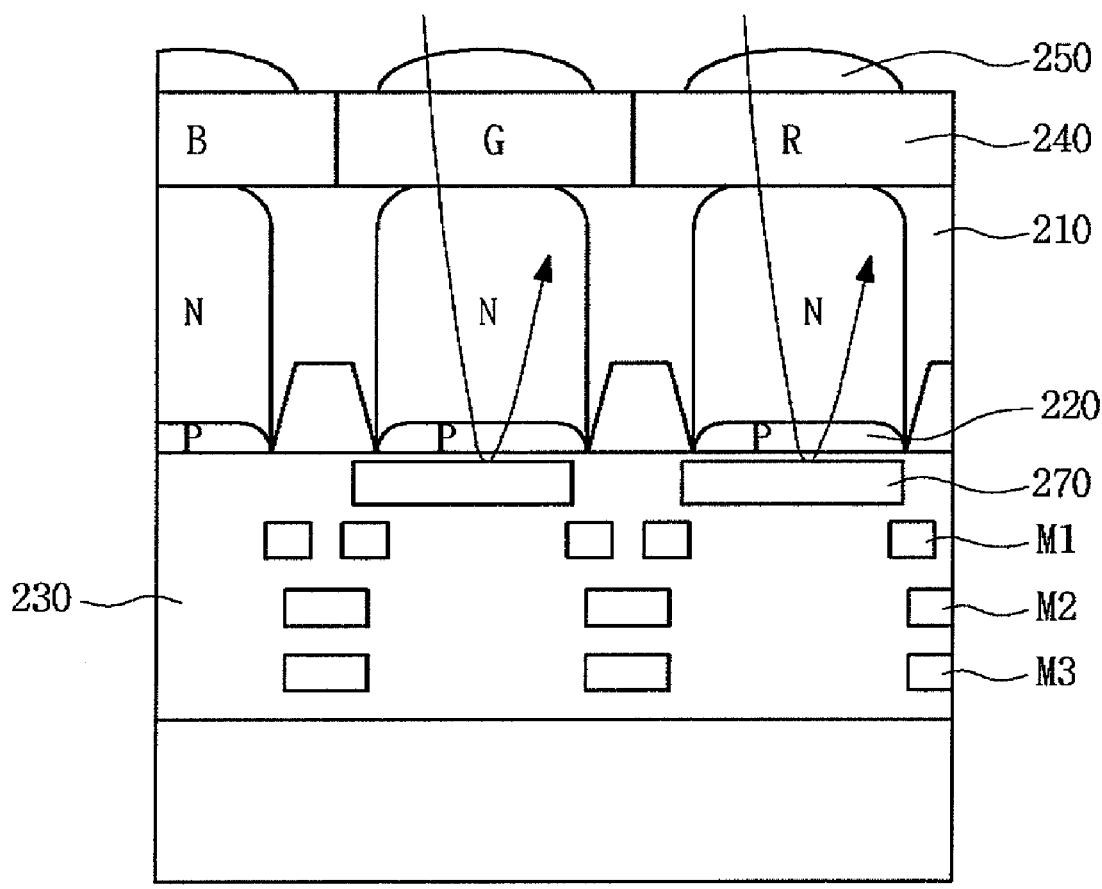
FIG. 3 is a cross-sectional view of a rear light-receiving type image sensor having reflectors according to an example embodiment.

In the front light-receiving type image sensor 100, in the front of which the light-receiving section is located, the incident light passing through the micro-lenses fails to reach the light-receiving section until the incident light passes through the interconnection layer, so that the sensitivity of the light receiving section tends to be reduced. As such, according to another example embodiment, a rear light-receiving type image sensor 200 as depicted in FIG. 3 will be used in place of the front light-receiving type image sensor.

Thus, the rear light-receiving type image sensor 200 is configured to sense light in a light-receiving section when the light is applied from the rear surface of a silicon substrate 210 (e.g., on the side opposite to an interconnection section), so that incident light gets no interference due to the layout of the interconnection section, e.g., the metal lines M1, M2 and M3.

Figure 2:
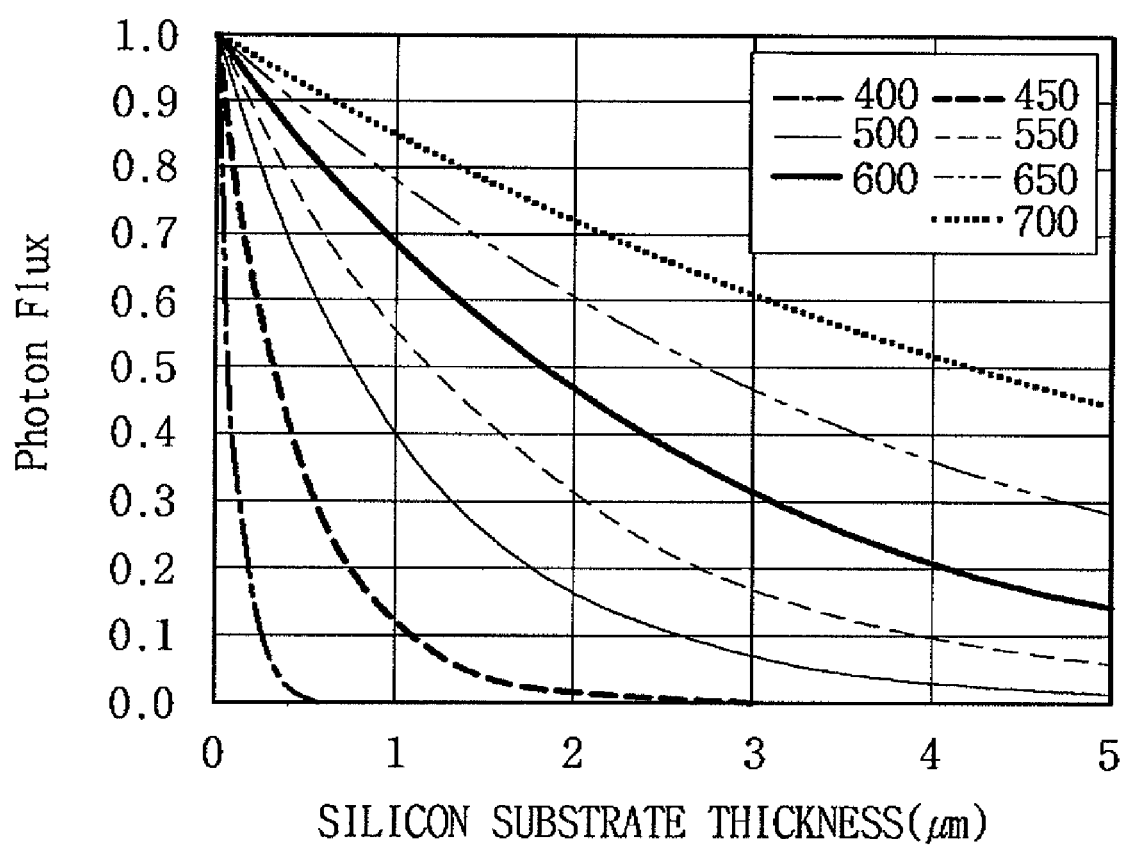
FIG. 2 is a graph illustrating how much light is absorbed depending on silicon thickness and wavelength according to an example embodiment.

The rear light-receiving section may, however, have the following difficulties. As illustrated in FIG. 2, it is known that the absorptance of light varies depending on wavelength $\lambda$. As the wavelength $\lambda$ becomes long, the depth of the light-receiving section absorbing the light may increase. Thus, the thickness of the silicon substrate may increase. This is opposed to a tendency to make semiconductor devices light, thin, short, and small.

Moreover, as the size of a pixel decreases, it may become more difficult to form a photodiode 220 using deep ion implantation. Furthermore, the quantity of the absorbed light may be reduced, and thus the sensitivity of the light-receiving section may be reduced as well. This may in turn cause degradation of a signal-to-noise ratio.

For example, as illustrated in FIG. 2, the thickness of the silicon substrate requires 10 μm or more to absorb light having a wavelength of 600 nm or more. Further, the thickness of the silicon substrate requires 5 μm or more to absorb light having a wavelength of 500 nm or more. However, taking into consideration that a design rule of the image sensor, and particularly, the thickness of the silicon substrate, is 4.5 μm or less, it can be seen that the light having a wavelength of 500 nm or more may not be absorbed for the most part.

In detail, when the light is applied from the rear surface of the silicon substrate 210, all the light is not collected on the light-receiving section in a long-wavelength region, for instance in a visible light region, but wholly transmits the light-receiving section. The transmitted light runs out of the front surface of the silicon substrate. In this manner, as the long-wavelength light to be collected on the light-receiving section is lost, the sensitivity of the light-receiving section may be significantly reduced.

For this reason, as illustrated in FIG. 3, reflectors 270 are formed in the dielectric layer such that the light passing through the photodiodes 220 can be collected on the photodiodes 220 again.

More specifically, because there are limitations in increasing the thickness of the silicon substrate 210 due to the reduced pixel size and the design rule, particularly in the ion implantation by which the photodiodes 220 may not be formed distant from the surface of the silicon substrate, the photodiodes are usually formed near the surface of the silicon substrate. As such, the longer the wavelength, the more the incident light is frequently lost without being absorbed by the photodiodes. Consequently, to absorb the unabsorbed light again, the reflectors 270 may be acutely required to be installed.

However, as the numerous metal lines M1, M2 and M3 are formed in the dielectric layer 230, there may be a limitation in arranging the reflectors 270. Even so, it may be very difficult to widely form the reflectors 270 due to an influence on the metal lines. In addition to the process of depositing the metal lines, a process of forming the reflectors 270 may separately be required, so that the number of processes can be increased.

Figure 4:
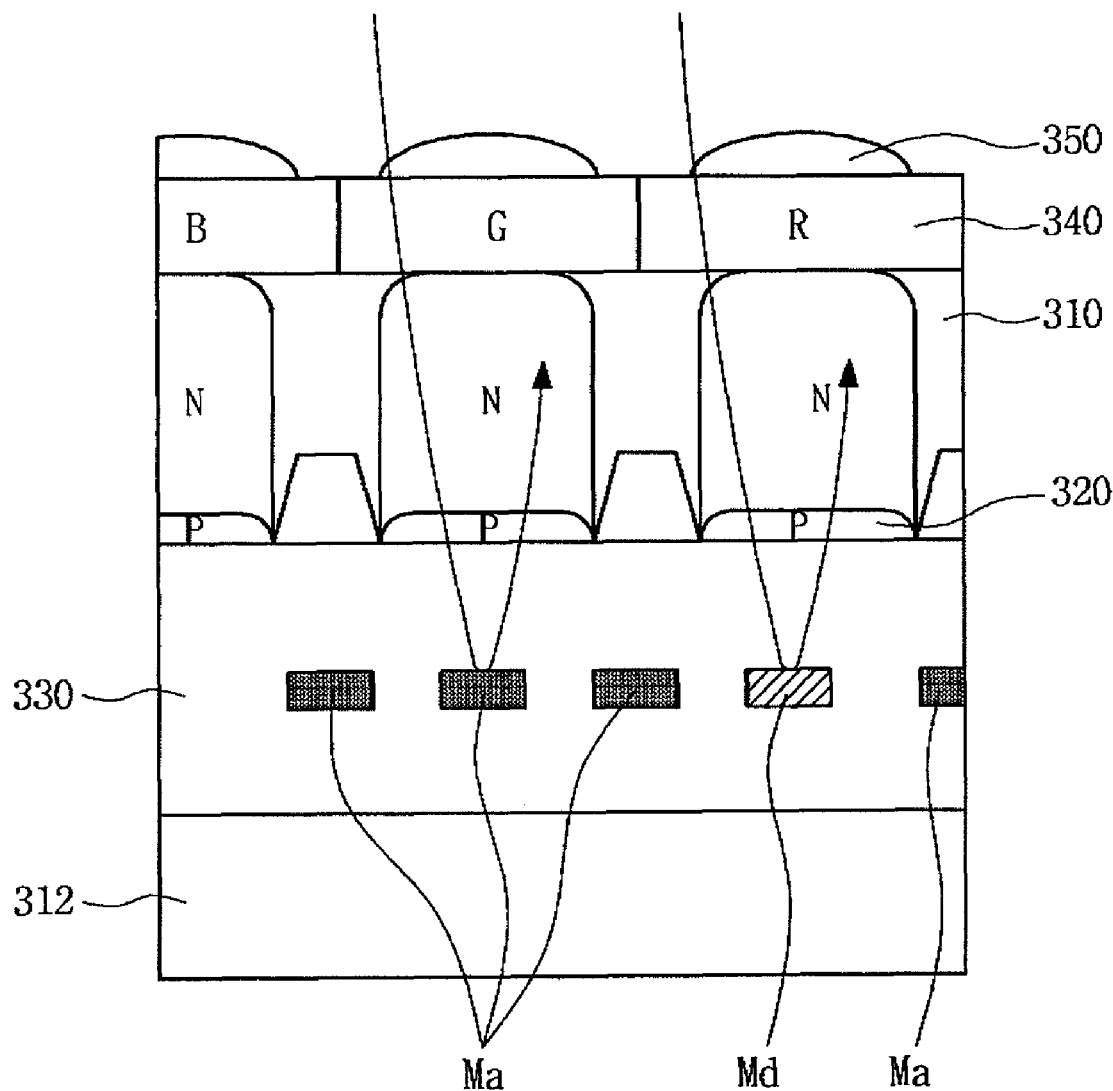
FIG. 4 is a cross-sectional view of an image sensor having a line-and-space type reflective pattern according to an example embodiment.

According to another example embodiment, as illustrated in FIG. 4, an image sensor 300 does not separately include reflectors. However, each metal line Ma is changed in the type of a reflector (or a reflective layer) to produce the same effect as the reflector when absorbing the light again. For example, the rear light-receiving type image sensor 300 is configured to arrange the metal lines Ma in a line-and-space (L/S) type in place of existing plane-type reflectors, so that the image sensor can maintain the reflecting effect of the reflector without forming the reflector.

However, in converting the metal lines Ma in the L/S type, there may be difficulties in connection with determining a pitch between the metal lines, e.g., a size of space, because the space size may vary depending on the profile of light having a different wavelength. Further, as a refractive index n varies depending on the property of a medium through which light passes, the space size may vary depending on the medium. In addition, the space size may vary depending on the thickness of a module through which light passes. In this manner, in consideration of various conditions, the space size should be determined.

First, as for the refractive index of the medium, a region where the light passes through the module may be generally divided into a silicon layer region having the photodiodes and a dielectric layer region having the metal lines. In detail, the light passes through both the silicon substrate 310 and the dielectric layer 330. The dielectric layer 330 may include, for example, silicon dioxide ($SiO_2$), plasma deposited silicon nitride (P-SiN), silicon oxynitride (SiON), or the like. $SiO_2$ has a refractive index n of 1.47, and P-SiN has a refractive index n of 2.07. SiON has a refractive index n of 2.76.

For example, when $SiO_2$ having a refractive index n of 1.47 is used for the dielectric layer 330, and light transmitted to the silicon substrate 310 has a wavelength $\lambda$ of 550 nm, the wavelength $\lambda$ of the light in the dielectric layer 330 may be substantially reduced to about 380 nm (=550 nm/1.44). Thus, when the width of a slit through which the light passes, e.g., the line interval L, is 190 nm corresponding to a half of the wavelength $\lambda$ of the light, diffraction occurs. When the line interval L is 190 nm or more, the light may be diffracted without reflection, and thus may be lost. As such, the light may not be absorbed to the silicon region again. Thus, the loss of the light may occur in proportion to a quantity of the light passing through the slit, so that the sensitivity may be reduced.

Figure 5:
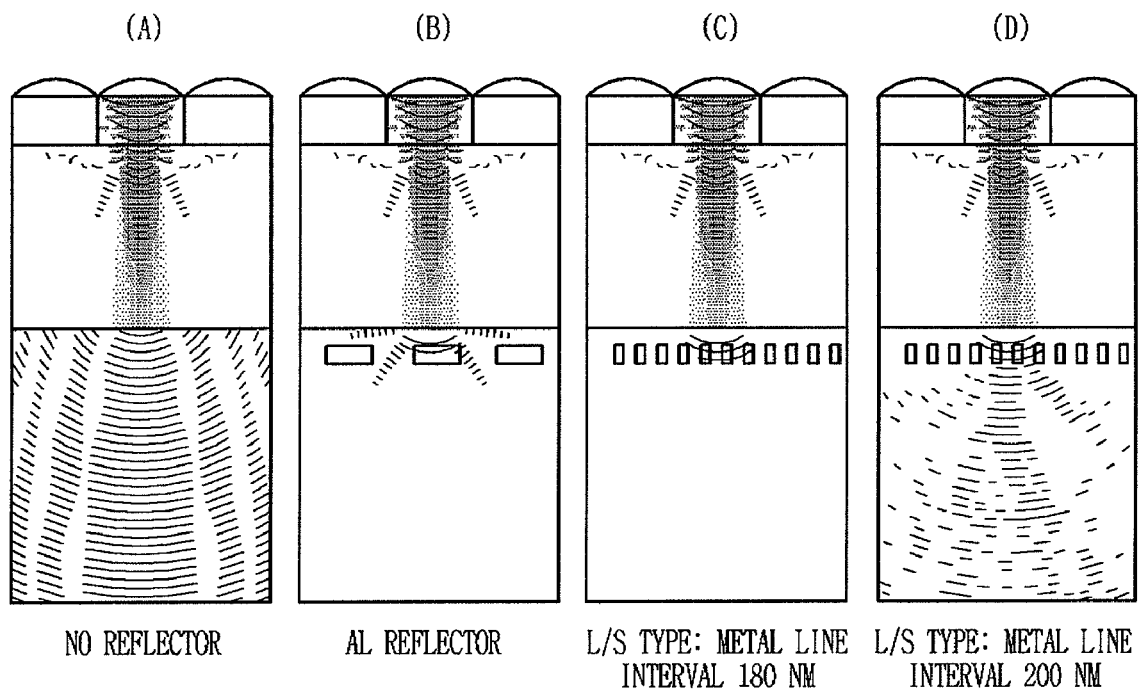
FIG. 5 is a cross-sectional view illustrating profiles of light when a dielectric layer is formed of silicon dioxide ($SiO_2$) and light having a wavelength of 550 nm is applied according to an example embodiment.

FIG. 5 illustrates profiles of light when a dielectric layer is formed of $SiO_2$ and light having a wavelength $\lambda$ of 550 nm is applied.

In (A) of FIG. 5, as there is no reflector, the light passing through the silicon substrate is not reflected on the dielectric layer, and thus is wholly lost. In (B) of FIG. 5, as there is a reflector, the light passing through the silicon substrate is reflected on the dielectric layer, and thus is mostly absorbed to the silicon substrate again. In (C) of FIG. 5, as there is no reflector, but the L/S type metal lines are formed in a line interval of 180 nm, the light passing through the silicon substrate is reflected on the dielectric layer, and thus is absorbed to the silicon substrate again. It can be seen that the light of (C) has substantially the same absorptance as the light of (B). In (D) of FIG. 5, as the metal lines exist, but have a line interval of 200 nm, the light is partially diffracted and lost.

Thus, it can be seen that, when the light having a wavelength of 500 nm passes through the dielectric layer formed of $SiO_2$, the light is diffracted when the line interval is within the limit of 190 nm. Thus, when the line interval exceeds 190 nm, the light transmits the dielectric layer without re-absorption. In this manner, on the basis of the profile of the light, it is possible to determine a minimum line interval through which the light passes.

Figure 6:
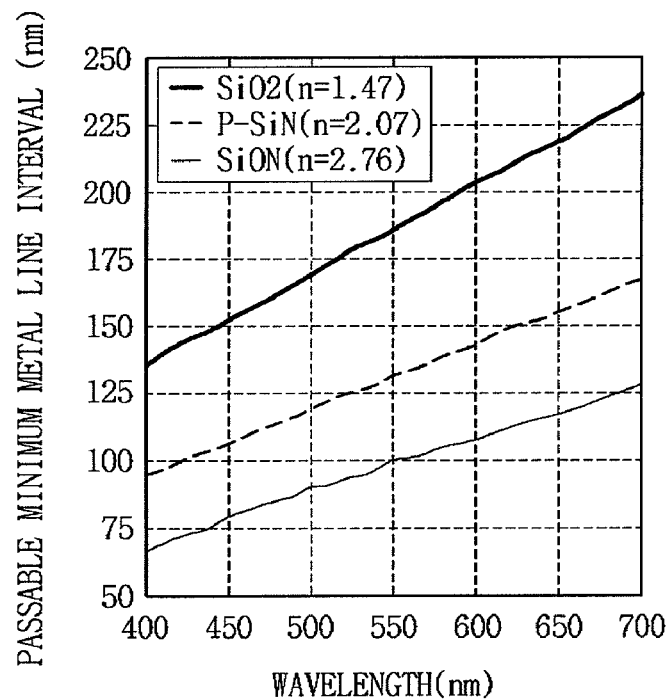
FIG. 6 is a graph illustrating a minimum metal-line interval through which light can pass depending on a refractive index and a wavelength of light according to an example embodiment.

FIG. 6 is a graph illustrating a minimum line interval through which light is passable depending on refractive index n and wavelength $\lambda$. As illustrated in FIG. 6, it can be seen that the refractive index varies depending on the properties of the dielectric layer, and the minimum line interval is determined depending on refractive index. It can be seen that, the greater the refractive index, the narrower the minimum line interval through which the light passes. It can be seen that the shorter the wavelength, the narrower the minimum line interval.

Figure 7:
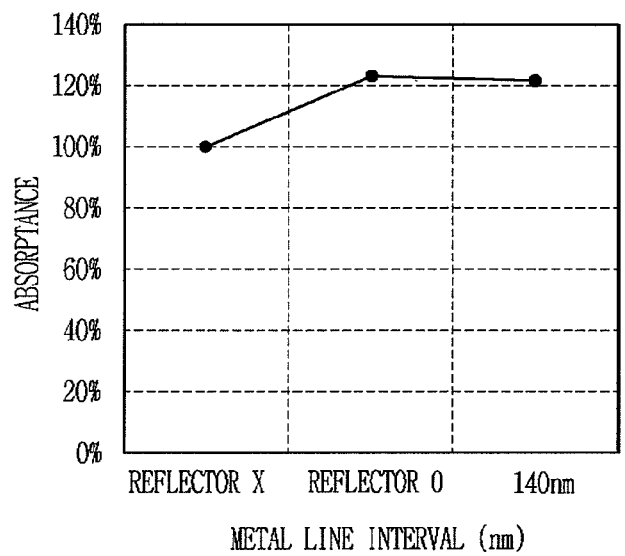
FIG. 7 is a graph illustrating how much light having a wavelength of 620 nm is absorbed in a silicon substrate in the cases where there does not exist a reflector, where there is a plane-type reflector, and where a metal line is formed in place of a reflector.

FIG. 7 is a graph illustrating absorptance of light having a wavelength $\lambda$ of 620 nm in a silicon substrate, in which the case where there is no reflector, the case where there is a plane type reflector, and the case where there are metal lines in place of the reflector are compared to each other through simulation. As illustrated, it can be seen that the plane type reflector has substantially the same absorptance as the L/S type metal lines.

Figure 8:
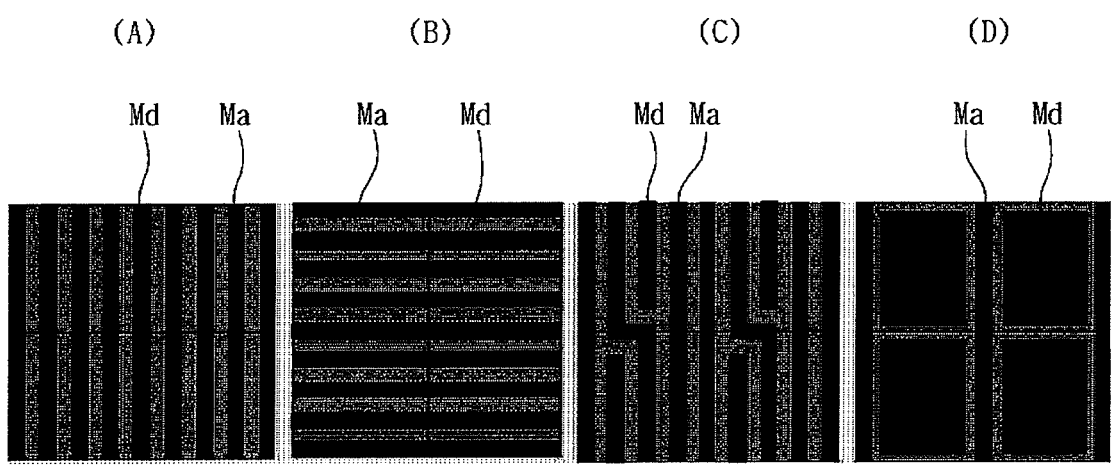
FIG. 8 is a plan view illustrating the case where metal lines are arranged at regular intervals in a transverse direction, the case where metal lines are arranged at regular intervals in a longitudinal direction, the case where metal lines are mixed and arranged in longitudinal and transverse directions, and the case where metal lines are arranged in combination with dummy patterns, according to an example embodiment.

As illustrated in FIG. 8, the L/S type metal lines may have various example embodiments.

In (A) of FIG. 8, the metal lines Ma are arranged at regular intervals in a transverse direction. In (B) of FIG. 8, the metal lines Ma are arranged at regular intervals in a longitudinal direction. In (C) of FIG. 8, the metal lines Ma are mixed and arranged in longitudinal and transverse directions. In (D) of FIG. 8, the metal lines Ma are arranged in combination with dummy patterns Md.

Meanwhile, when the minimum line interval is determined as described above, the number of metal lines to be formed may exceed the number of metal lines required to operate a circuit. In this case, all the metal lines may not be formed as interconnections required to operate the circuit, and thus some of the metal lines may be formed as line-type dummy patterns Md as needed. Comparing the dummy pattern with an existing reflector, the dummy pattern Md has a line type and thus does not need a separate process, whereas the reflector has a plane type and thus needs a separate process. There is a benefit in that these dummy patterns are deposited and etched at the same time when the metal lines Ma are formed.

Further, it is not essential to form the dummy pattern in the line type. Although the metal line has a line type, the dummy pattern may be formed in a box type, as illustrated in (D) of FIG. 8. The type of the dummy pattern may be properly modified and used according to conditions of the metal line.

Hereinafter, a method of fabricating an image sensor will be described with reference to FIG. 4 by way of example.

Photodiodes 320 are formed in a silicon substrate 310 through an ion implantation process. Here, for isolation, the silicon substrate 310 may be selectively etched to form trenches, and then a dielectric layer may be filled to form a field oxide layer. Further, a floating diffusion region may be formed in the same plane as the photodiodes. Transfer or reset transistors may be formed on the silicon substrate 310 having the photodiodes.

A dielectric layer 330 is formed on the photodiodes 320 and transistors using, for example, an oxide and/or nitride layer made of $SiO_2$, P-SiN, SiON, or the like. For clarity, the dielectric layer prior to metallization and the dielectric layer posterior to metallization are denoted as the dielectric layer 330 without discrimination. The metal lines Ma are patterned on the dielectric layer in an L/S type using, for example, aluminum, copper or tungsten. The pattern may be formed in a longitudinal or transverse direction or in a box type.

According to an example embodiment, the metal lines M1, M2 and M3 are arranged in a vertical direction, so that a process of forming the dielectric layer is repeated by the number of layers of the metal lines to form a multi-layered metal line. However, according to another example embodiment, the metal lines Ma may be formed in a single layer, so that a process of repeatedly stacking a metal ILD for forming interconnections and a process of performing surface polishing can be removed.

Thus, when the metal lines are formed in multiple layers, a process of forming and planarizing the dielectric layer is repeated by the number of metal line layers, which may in turn result in increasing production costs and process failure. In contrast, when the metal lines are formed in a single layer, it is possible to reduce production costs and prevent process failure.

The dielectric layer is stacked on the metal lines Ma again, and planarized through a planarization process.

To process the rear surface of the silicon substrate 310, the silicon substrate 310 is turned upside down such that the front surface of the silicon substrate 310 is oriented downward. For convenience of the rear-surface processing, a support plate 312 made of silicon or $SiO_2$ is attached to the front surface of the silicon substrate 310. The rear surface of the silicon substrate is back-lapped to adjust the thickness of the silicon substrate 310 according to the design rule of the image sensor. At this time, although the thickness of the silicon substrate 310 is reduced, the silicon substrate 310 is prevented from being twisted or damaged due to the support plate 312.

Color filters 340 are formed on the back-lapped rear surface of the silicon substrate. Micro lenses 350 for focusing light are formed on the respective color filters 340. Thereby, the image sensor 300 is obtained.

As described above, in the case of the front light-receiving type image sensor, as the light incident through the lenses reaches the light receiving section after passing through the numerous interconnection layers, the sensitivity of the light receiving section tends to be reduced. This is equally applied to the case where the light receiving section is aligned in a vertical direction. However, in the case of the rear light-receiving type image sensor, as the light is applied on the side opposite to the interconnection layers, the sensitivity of the light receiving section is enhanced. However, the absorptance of the light in the light receiving section varies depending on wavelength. As such, in the case of a long wavelength such as a visible light wavelength, the light-receiving section capable of absorbing the light has a sufficient depth. Nevertheless, due to a tendency to make the image sensor light, thin, short, and small, and a limitation of ion implantation, the sensitivity of the rear light receiving section still tends to be reduced. For this reason, the dielectric layer may be required to serve as the reflector such that the light passing through the light receiving section can be reflected and collected on the light receiving section again. However, due to the layout of the interconnection layer, the space where the reflectors are formed in the dielectric layer may be too narrow. Even so, it may be very difficult to widely form the reflectors. As such, without separately forming the reflector, the interconnection layer is converted to the reflector, and the block-type reflector is converted to the L/S type metal line, so that the image sensor can maintain the reflecting effect of the reflector without forming the reflector. Thus, the interconnection layer serving as an electrical circuit interconnection is implemented as the L/S type metal line. However, as the diffracted light may be lost depending to the interval between the metal lines, it may be necessary to determine the minimum line interval causing no diffraction. The minimum line interval is dependent on a depth of the light receiving section, a wavelength of incident light, and a refractive index of light in the dielectric layer. The greater the refractive index, the narrower the minimum line interval through which the light passes. The shorter the wavelength of light, the narrower the minimum line interval. In consideration of the above factors, it may be necessary to determine optimal conditions of the minimum line interval. To this end, when the minimum line interval is not obtained only by the metal lines serving as the interconnections, the dummy pattern is interposed between the metal lines, so that the same reflecting effect as an existing plane-type reflector can be produced. It can be understood that this configuration is adopted as a technical idea.

As described above, the image sensor according to example embodiments may have the following effects.

First, the light collected on lenses is directly applied to the rear surface of the light receiving section without passing, so that the sensitivity can be improved.

Second, although the pixel size and the thickness of the silicon substrate are reduced, the light passing through the silicon substrate may be reflected on the dielectric layer, and then is absorbed to the silicon substrate again, so that the sensitivity can be improved.

Third, the reflective layer is directly formed using an existing electrical circuit interconnection layer, so that the reflective layer can be properly disposed according to the conditions of the image sensor without being influenced by the layout of the interconnection layer.

Fourth, the reflective layer pattern is formed in the L/S type, and thus the reflective layer may have the same reflectance as a plane-type reflective layer although the reflective layer is formed in a plane type. Thus, the production cost can be reduced.

Fifth, the minimum line interval is determined depending on the wavelength of light and the refractive index of the dielectric layer, so that the sensitivity can be appropriately adjusted according to the conditions of the light and dielectric layer.

Sixth, the line interval can be adjusted using the dummy pattern without using all the electrical circuit interconnections, so that the reflecting function can be optimized regardless of a kind and function of the circuit.

Seventh, the process of forming the reflector may be removed, so that the number of processes can be reduced.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. An image sensor, comprising:
   at least one photoelectric conversion device formed in a substrate;
   at least one lens formed on one side of the substrate configured to collect light;
   a dielectric layer including an interconnection formed on the other side of the substrate; and
   a reflective pattern formed in the dielectric layer,
   wherein the reflective pattern is configured to reflect the light passing through the dielectric layer such that the light is absorbed to the photoelectric conversion device again, wherein the reflective pattern includes metal lines formed in a line-and-space type, wherein some of the metal lines are formed as interconnections for operating a circuit and another of the metal lines include a dummy pattern not serving to operate the circuit and wherein the dummy pattern is disposed between a pair of the metal lines formed as interconnections and overlaps the at least one photoelectric conversion device.

2. The image sensor according to claim 1, wherein the substrate is formed of silicon and, the photoelectric conversion device includes at least one photodiode formed in the silicon substrate to convert light energy into an electrical signal.

3. The image sensor according to claim 2, wherein the circuit includes a logic device processing the electrical signal converted by the photoelectric conversion device and converting the electrical signal into data or a peripheral circuit device formed therearound to control the photoelectric conversion device and the logic device and process signals of the photoelectric conversion device and the logic device.

4. The image sensor according to claim 2, wherein the metal lines are configured such that a minimum line interval therebetween is determined depending on a refractive index of the dielectric layer and is inversely proportional to the refractive index of the dielectric layer.

5. The image sensor according to claim 4, wherein the dielectric layer is formed of an oxide, and the minimum line interval is determined to be less than 200 nm in a range of visible light having a wavelength of 600 nm or more.

6. The image sensor according to claim 2, wherein the metal lines are configured such that a minimum line interval therebetween is determined depending on a wavelength of light and is proportional to the wavelength of light.

7. The image sensor according to claim 2, wherein the line-and-space type metal lines are arranged at regular intervals in a longitudinal direction.

8. The image sensor according to claim 2, wherein the line-and-space type metal lines are arranged at regular intervals in a transverse direction.

9. The image sensor according to claim 2, wherein the line-and-space type metal lines are mixed and arranged in longitudinal and transverse directions.

10. The image sensor according to claim 2, wherein a minimum line interval between the metal lines is obtained by the dummy pattern.

11. The image sensor according to claim 10, wherein the dummy pattern is formed in a box type.

12. The image sensor according to claim 1, wherein the reflective pattern is aligned with the photoelectric conversion device.

13. A rear light-receiving type image sensor comprising:
a substrate having a rear light receiving section formed therein, wherein the rear light receiving section includes at least one photodiode;
a plurality of color filters formed on a rear surface of the substrate;
a plurality of micro-lens formed on the plurality of color filters and configured to collect light;
a dielectric layer formed on a front surface of the substrate opposite to the plurality of color filters and the plurality of micro-lens, wherein the dielectric layer comprises one of silicon dioxide ($SiO_2$), plasma deposited silicon nitride (P-SiN), or silicon oxynitride (SiON), wherein the dielectric layer includes metal lines formed in a line-and-space type, wherein some of the metal lines are formed as interconnections for operating a circuit and another of the metal lines include a dummy pattern not serving to operate the circuit and wherein the dummy pattern is disposed between a pair of the metal lines formed as interconnections and overlaps the at least one photodiode, and wherein the metal lines reflect light such that the light passing through the substrate is absorbed to the substrate again without being lost in a front direction of the substrate and is collected on the rear light receiving section again.

14. The image sensor according to claim 13, wherein the metal line is configured so that a shape thereof is determined by a minimum line interval between the metal lines through which no light is allowed to pass by diffraction, and the minimum line interval is proportional to a wavelength of applied light to increase as the wavelength becomes long, and is inversely proportional to a refractive index of the dielectric layer to decrease as the refractive index become high.

15. The image sensor according to claim 14, wherein the dielectric layer includes an oxide layer having a refractive of 1.5 or less such that the minimum line interval is less than 200 nm in a range of visible light having a wavelength of 600 nm or more.

16. The image sensor according to claim 14, wherein requirements for the minimum line interval between the metal lines are met by the dummy pattern.

17. The image sensor according to claim 13, wherein the metal lines are vertically aligned with the photodiode.

* * * * *